United States Patent Office 3,528,021

Patented Sept. 8, 1970

3,528,021
TUNED AMPLIFIER NEUTRALIZING CIRCUIT

Mitsunari Okasaki, Tokyo, Japan, assignor to Alps Electric Company, Limited, Tokyo, Japan, a Japanese corporation Filed July 3, 1968, Ser. No. 742,370
Claims priority, application Japan, Feb. 20, 1968, 43/10,275
Int. Cl. H03f 1/14
U.S. Cl. 330—27 4 Claims

ABSTRACT OF THE DISCLOSURE

A tuned amplifier of the type comprising a semiconductor amplifying element, a tuned resonant circuit having a variable capacitance and inductance, and a neutralizing element, a bridge circuit being defined between the input and output of the amplifier, in which the variable capacitance is so connected in the circuit that it is outside that bridge circuit.

Figure 1A:
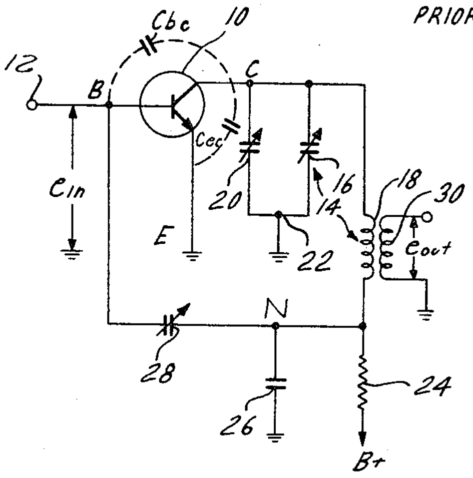

The present invention relates to a tuned amplifier circuit, and in particular to a tuned amplifier circuit having a neutralizing element connected between its output and input terminals to compensate for the effects of the interelectrode capacitances of the amplifying element.

The development of transistor technology has made possible the use of transistors as the amplifying elements in high frequency amplifiers and tuned amplifiers. However, due to the inherent presence of interelectrode capacitance between the input and output electrodes of the transistor amplifier, the transistor acts as a bilateral device, that is, a device in which variation in the output impedance is reflected as a variation in the input impedance. To compensate for this bilateral operation, particularly at high frequencies, a neutralizing element such as a feedback capacitance is commonly connected between the output and input terminals of the amplifying element to provide essentially unilateral operation of the amplifier over the operative frequency band.

A tuned amplifier of the type incorporating a transistor as the amplifying element has a tuning circuit provided in the output circuit of the amplifier, that tuning circuit generally comprising a variable capacitance in resonant circuit arrangement with an inductance. In the conventional tuning circuit of this type, one terminal of the variable capacitance is connected directly to ground, the other terminal being operatively or directly connected to one terminal of the inductance.

In the conventional tuned amplifier circuit described above, an equivalent bridge circuit is defined between the input and output terminals of the amplifier, the legs of that bridge being defined by, inter alia, the neutralizing capacitance and the transistor interelectrode capacitance. Significantly, one leg of the bridge includes the variable tuning capacitance of the tuning circuit.

Upon an analysis of this equivalent bridge circuit, it is seen that the balance of the bridge circuit, necessary for optimum neutralization to take place, is dependent upon the value of the capacitance of the variable capacitance, and that is achieved for only one value of this capacitance; the bridge becomes unbalanced when the capacitance departs from that one value. The capacitance must, however, be varied; that is how the amplifier is tuned. Hence the bridge balance must be upset as the amplifier is tuned, with consequent deterioration of neutralization characteristics.

This problem is particularly apparent at low tuning frequencies, where the value of the variable capacitance is considerably greater than the output interelectrode capacitance of the transistor, with which the variable capacitance is in effective parallel arrangement in one leg of the bridge circuit. Therefore, the balance of this bridge will be quickly upset even by a relatively slight variation of the variable capacitance.

It will thus be apparent that it is possible to obtain effective neutralizing balance over the entire frequency range of amplifier operation only by providing circuitry to compensate for variation of the variable capacitance, which would otherwise unbalance the bridge circuit. Such additional circuitry would be relatively complex and would add additional components to what desirably should be a simple circuit.

It is thus the prime object of the present invention to provide a tuned amplifier circuit having a neutralizing element in which variation of the variable tuning capacitance does not upset the balanced neutralizing condition.

It is a further object of the present invention to provide a tuned amplifier circuit of this type, in which neutralizing balance is maintained independent of the value of the variable capacitance by means of a highly effective modification of the known tuned amplifier circuit.

To these ends the present invention comprises a transistorized tuned amplifier in which a neutralizing feedback circuit is provided and which has a tuning circuit comprising a variable capacitance in its output circuit in which the variable capacitance is connected to its associated inductance in such a manner that the variable capacitance is connected outside the equivalent bridge circuit, said bridge circuit being defined by the other circuit element between the amplifier input and output terminals. As a result of this novel circuit arrangement, balance of the bridge is maintained substantially independently of the variable capacitance and thus independent of the frequency to which the amplifier is tuned.

Figure 1B:
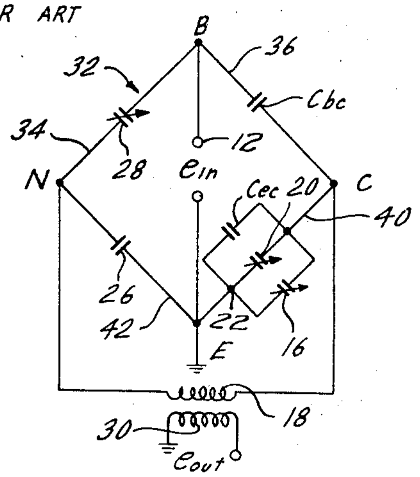
FIG. 1b PRIOR ART
Figure 2A:
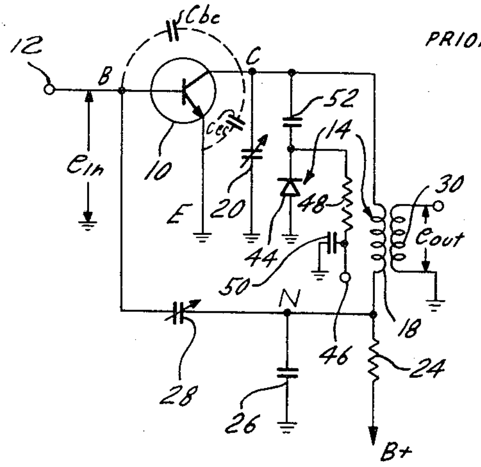
Figure 2B:
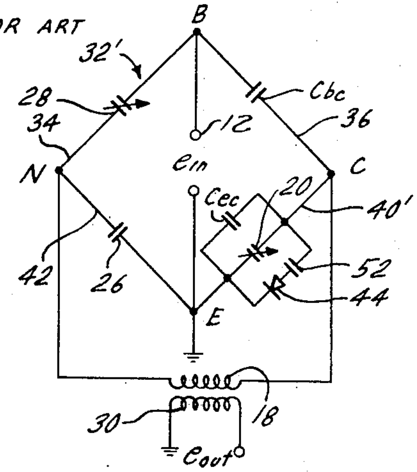
FIG. 2b PRIOR ART
Figure 3A:
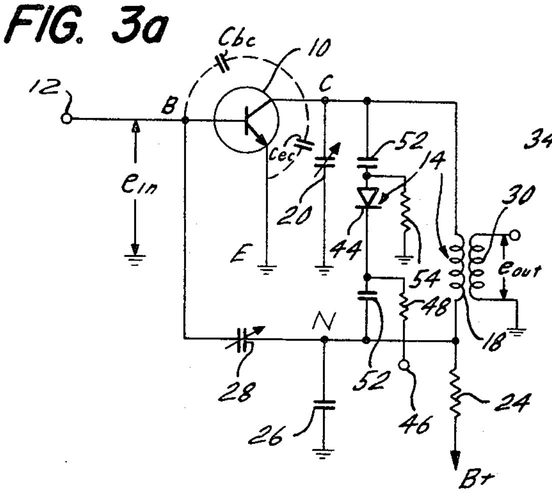
Figure 3B:
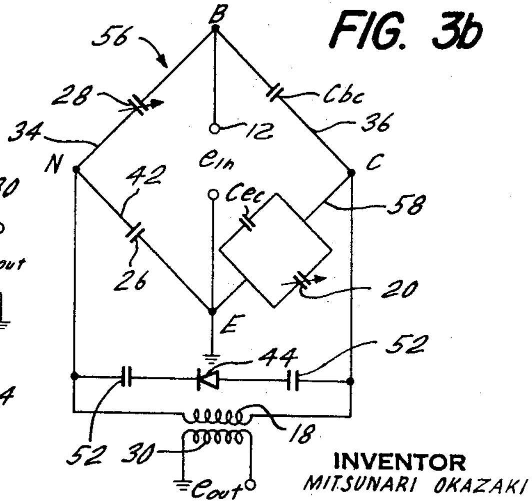

To the accomplishment of the above, and to such other objects as may hereinafter appear, the present invention relates to the design of a tuned circuit as defined in the accompanying claims and as described in this specification, taken together with the accompanying drawings in which:

FIGS. 1*a* and 1*b* are schematic diagrams of a prior art tuned amplifier circuit and its respective equivalent bridge circuit in which the variable tuning element is a variable capacitance;

FIGS. 2*a* and 2*b* are respectively schematic diagrams of a pirior art turning circuit and its equivalent bridge circuit in which the tuning element is a variable capactance diode; and FIGS. 3*a* and 3*b* are respetcively schematic diagrams of the amplifier circuit design of the present invention and its equivalent bridge circuit, in which the tuning element is a variable capacitance diode.

Two representative prior art tuned amplifier circuits are illustrated in FIGS. 1*a* and 2*a*, FIGS. 1*b* and 2*b* being respectively the equivalent bridge circuits of the circuits shown in FIGS. 1*a* and 2*a*. The circuit of FIG. 1*a* comprises an amplifying transistor 10 having the conventional base, emitter and collector electrodes. The input signal is applied between point 12 and ground and is connected directly to the base of transistor 10. A tuning circuit, generally designated as 14 and comprising variable capacitor 16 and inductance 18, is connected in the output or collector circuit of transistor 10. A trimmer capacitor 20 is connected in parallel with variable capacitance 16, one terminal of each capacitance 16 and 20 being connected directly to ground at point 22. The power supply voltage is applied to the collector of transistor 10 through a resistor 24, an A.C. bypass capacitor 26 being connected across resistor 24 and to ground. The output signal of the circuit is taken across a secondary winding 30 placed in transformer relationship with inductance 18.

TUNED AMPLIFIER NEUTRALIZING CIRCUIT

Filed July 3, 1968

INVENTOR
MITSUNARI OKAZAKI
BY James and Franklin
ATTORNEY ductance means and all of said variable capacitance means of the totality of said tuning means associated with said amplifier element being connected across the output terminals of said bridge circuit and electrically outside said bridge circuit.

2. The amplifier circuit of claim 1, in which said variable capacitance means comprises a variable capacitance diode having a pair of terminals, and comprising means for applying a biasing signal to said variable capacitance diode, and a pair of capacitors connected between said diode terminals and said inductance.

3. The amplifier circuit of claim 1, in which said variable capacitance means and said inductance each comprise a pair of terminals, and means operatively electrically connecting the terminals of said variable capacitance means to corresponding terminals of said inductance.

4. The amplifier circuit of claim 3, in which said variable capacitance means comprises a variable capacitance diode having a pair of terminals, and comprising means for applying a biasing signal to said variable capacitance diode, said connecting means comprising a pair of capacitors connected between said diode terminals and said inductance.

References Cited

UNITED STATES PATENTS

| | | | |
|---|---|---|---|
| 2,162,535 | 6/1939 | Little | 330—76 |
| 2,940,051 | 6/1960 | Korn et al. | 330—27 |
| 3,307,115 | 2/1967 | Tschannen | 331—36 X |

ROY LAKE, Primary Examiner

J. B. MULLINS, Assistant Examiner

U.S. Cl. X.R.

330—76